(12) United States Patent
Snowdon

(10) Patent No.: US 8,928,142 B2
(45) Date of Patent: Jan. 6, 2015

(54) APPARATUS RELATED TO CAPACITANCE REDUCTION OF A SIGNAL PORT

(71) Applicant: Fairchild Semiconductor Corporation, San Jose, CA (US)

(72) Inventor: Kenneth P. Snowdon, Fairmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/774,135

(22) Filed: Feb. 22, 2013

(65) Prior Publication Data

US 2014/0239447 A1    Aug. 28, 2014

(51) Int. Cl.
| | | |
|---|---|---|
| *H01L 23/488* | (2006.01) | |
| *H01L 27/10* | (2006.01) | |
| *H01L 23/498* | (2006.01) | |
| *H01L 23/00* | (2006.01) | |

(52) U.S. Cl.
CPC ........ *H01L 27/101* (2013.01); *H01L 23/49816* (2013.01); *H01L 24/13* (2013.01)
USPC ............................. 257/738; 257/758; 438/614

(58) Field of Classification Search
CPC ................... H01L 23/49811; H01L 23/49816; H01L 24/13
USPC .................... 257/737, 738, 758; 438/613, 614
See application file for complete search history.

(56) References Cited

U.S. PATENT DOCUMENTS

| | | | | |
|---|---|---|---|---|
| 3,319,311 | A | * | 5/1967 | Mutter .......................... 438/508 |
| 3,456,158 | A | * | 7/1969 | Davis, Jr. et al. .............. 361/765 |
| 5,534,465 | A | * | 7/1996 | Frye et al. ...................... 438/108 |
| 6,605,854 | B2 | * | 8/2003 | Nagase et al. ................ 257/476 |
| 6,717,238 | B2 | | 4/2004 | Ker et al. |
| 7,023,085 | B2 | | 4/2006 | Pu |
| 7,026,234 | B2 | | 4/2006 | Jao et al. |
| 7,196,000 | B2 | | 3/2007 | Lee et al. |
| 7,314,780 | B2 | * | 1/2008 | Shimizu et al. ............... 438/108 |
| 7,391,114 | B2 | | 6/2008 | Mimura et al. |
| 7,868,409 | B2 | | 1/2011 | Sasaki |
| 8,310,295 | B2 | | 11/2012 | Hollis |
| 2002/0043727 | A1 | | 4/2002 | Wu |
| 2004/0262635 | A1 | * | 12/2004 | Lee ............................... 257/199 |
| 2005/0104133 | A1 | * | 5/2005 | Kanno et al. .................. 257/371 |
| 2005/0242416 | A1 | | 11/2005 | Chen |
| 2007/0007662 | A1 | * | 1/2007 | Shindo et al. ................. 257/778 |
| 2008/0237656 | A1 | * | 10/2008 | Williams et al. .............. 257/262 |
| 2014/0061874 | A1 | * | 3/2014 | Kim .............................. 257/653 |

* cited by examiner

*Primary Examiner* — Allan R Wilson
(74) *Attorney, Agent, or Firm* — Brake Hughes Bellermann LLP

(57) ABSTRACT

In one general aspect, an apparatus includes a first capacitor defined by a dielectric disposed between a bump metal and a region of a first conductivity type, and a second capacitor in series with the first capacitor and defined by a PN junction including the region of the first conductivity type and a region of a second conductivity type. The region of the first conductivity type can be configured to be coupled to a first node having a first voltage, and the region of the second conductivity type can be configured to be coupled to a second node having a second voltage different than the first voltage.

21 Claims, 6 Drawing Sheets

APPARATUS RELATED TO CAPACITANCE REDUCTION OF A SIGNAL PORT

TECHNICAL FIELD

This description relates to reducing capacitance of a signal port of a computing component.

BACKGROUND

A signal port of a computing component can have a capacitance that degrades a signal (e.g., a digital signal, an analog signal) communicated via the signal port. The signal port can include, for example, an input/output (I/O) port. For example, an input port of a computing component can have an input capacitance that degrades a relatively high speed signal (e.g., a signal greater than 1 Gigahertz (GHz) communicated via the input port. The capacitance can be due, at least in part, to a size (e.g., a surface area) of a metal contact (e.g., a bump metal) associated with the input port. Thus, a need exists for systems, methods, and apparatus to address the shortfalls of present technology and to provide other new and innovative features to reduce input capacitance.

SUMMARY

In one general aspect, an apparatus includes a first capacitor defined by a dielectric disposed between a bump metal and a region of a first conductivity type, and a second capacitor in series with the first capacitor and defined by a PN junction including the region of the first conductivity type and a region of a second conductivity type. The region of the first conductivity type can be configured to be coupled to a first node having a first voltage, and the region of the second conductivity type can be configured to be coupled to a second node having a second voltage different than the first voltage.

The details of one or more implementations are set forth in the accompanying drawings and the description below. Other features will be apparent from the description and drawings, and from the claims.

DETAILED DESCRIPTION

Figure 1:
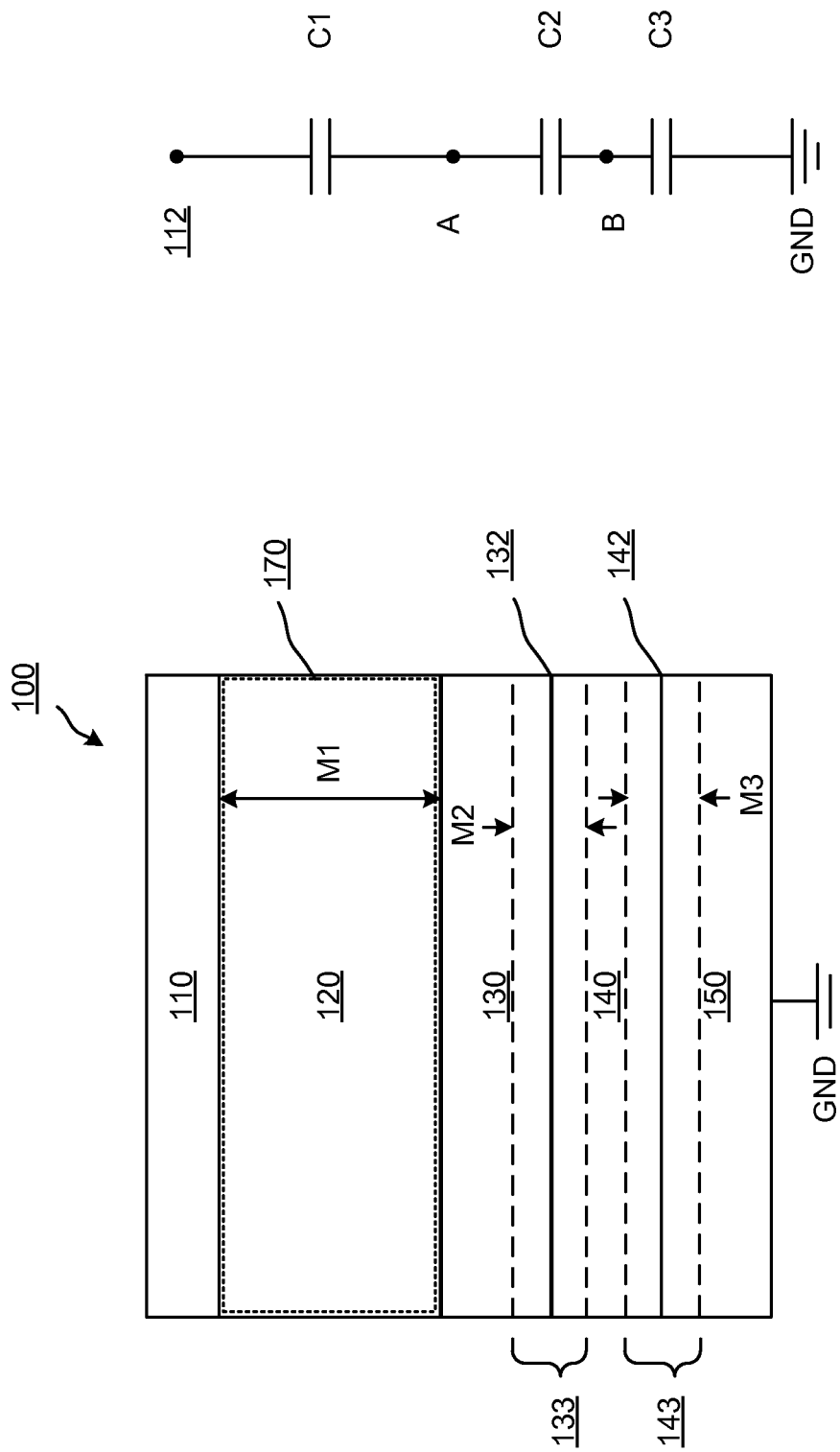
FIG. 1A is a diagram of a side cross-sectional view of at least a portion of a signal port of a computing component.
FIG. 1B is a circuit diagram representation of the signal port portion shown in FIG. 1A.

FIG. 1A is a diagram of a side cross-sectional view of at least a portion of a signal port of a computing component. The portion of the signal port can be referred to as a signal port portion 100. In some embodiments, the signal port portion 100 can be included in an input port of a computing component and/or an output port of a computing component. The computing component can be included in, or can be part of, an integrated circuit and/or can be included in a discrete semiconductor device.

As shown in FIG. 1A, the signal port portion 100 has a dielectric 120 disposed between a bump metal 110 and a region 130 (also can be referred to as a semiconductor region) so that the bump metal 110 is disposed on the dielectric 120 (and the dielectric 120 is disposed below the bump metal 110) and so that the dielectric 120 is disposed on the region 130 (and the region 130 is disposed below the dielectric 120). A region 140 (also can be referred to as a semiconductor region) is disposed between the region 130 and a region 150 (also can be referred to as a semiconductor region) so that the region 130 is disposed on the region 140 (and the region 140 is disposed below the region 130) and so that the region 140 is disposed on the region 150 (and the region 150 is disposed below the region 140). In this embodiment, the signal port portion 100 is oriented so that the bump metal 110 is toward a top of the signal port portion 100, and the region 150 is toward a bottom of the signal port portion 100. In some embodiments, a direction between the top of the signal port portion 100 and the bottom of the signal port portion 100 can be referred to as a vertical direction, and a direction that is substantially orthogonal to the vertical direction can be referred to as a horizontal direction or as a lateral direction. In some embodiments, the dielectric 120 can be referred to as a dielectric region.

The bump metal 110 can function as a contact metal (also can be referred to as a contact pad and/or can function as a terminal). A signal (e.g., a digital signal, an analog signal, an input signal, an output signal, a communication signal) can be communicated via the bump metal 110. The bump metal 110 can have a surface area size on the order of thousands of square microns (e.g., 10,000 $\mu m^2$, 50,000 $\mu m^2$, 100,000 $\mu m^2$). In some embodiments, the bump metal 110 can have a size greater than a size of, for example, a bond pad, which can have a surface area less than 5 times the surface area of the bump metal 110. In some embodiments, the area of the bump metal 110 (which can be coupled with, for example, a solder ball) can be more than 10 times greater than that of a bond pad. As a specific example, the bump metal 110 can be greater than or equal to approximately 40,000 $\mu m^2$ while a bond pad can be approximately 2,500 $\mu m^2$.

The region 130 can be doped with one or more dopants of a first conductivity type (e.g., a P-type dopant, an N-type dopant) and the region 140 can be doped with one or more dopants of a second conductivity type (e.g., a P-type dopant, an N-type dopant) having a conductivity opposite a conductivity of the first conductivity type so that an interface between the region 130 and the region 140 forms a PN junction 132. Similarly, the region 140 can be doped with one or more dopants of the second conductivity type and the region 150 can be doped with the one or more dopants of the first conductivity type so that an interface between the region 140 and the region 150 forms a PN junction 142. In some embodiments, one or more of the dopants of the first conductivity type or the second conductivity type can be implanted using one or more implant processes.

Figure 2:
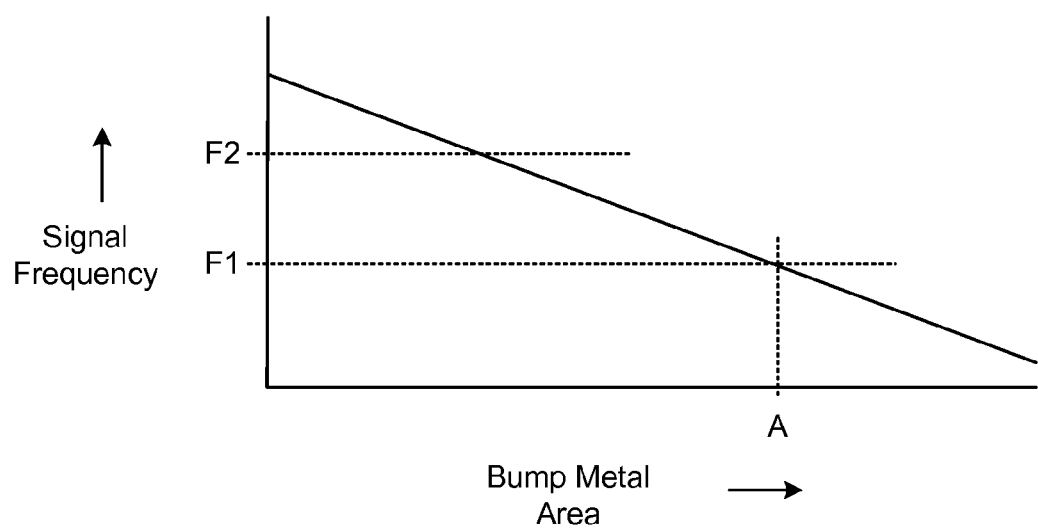
FIG. 2 is a graph that illustrates a relationship between an area of a bump metal and a signal frequency.

A relatively high speed signal (e.g., a 1 GHz signal, a 10 GHz signal, a 100 GHz signal) communicated through a signal port portion can be degraded by a capacitance value of the signal port portion. Specifically, the high speed signal can be degraded by (e.g., attenuated by) a resistor-capacitor (RC) time constant that is increased by a relatively large capacitance value. The capacitance value can be a relatively large capacitance value that causes degradation of a relatively high speed signal when a surface area of a contact metal (such as the bump metal 110) is relatively large (because capacitance is directly proportional to area of the contact metal). FIG. 2 is a graph that illustrates a relationship between bump metal area and a signal frequency (or bandwidth) that can be reliably processed.

As shown in FIG. 2, as bump metal area increases (shown along the x-axis), a signal frequency (or bandwidth) that can be reliably processed decreases (shown along the y-axis). In some embodiments, the signal frequency represented in FIG. 2 can be a 3 decibel (dB) attenuation frequency. This decrease is due, in part to the fact that, as the area of the bump metal increases, a capacitance value associated with the bump metal also increases (e.g., increases linearly). For instance, as the capacitance value associated with the bump metal increases, a rise time and/or a fall time of a signal applied to the bump metal can be degraded by the capacitance. Accordingly, a bit error rate associated with the signal, a quality of the data associated with the signal, and/or so forth can be degraded by a relatively high capacitance. While this relationship is illustrated in FIG. 2 is a linear curve, in some embodiments the relationship between the bump metal area and the signal frequency can be a nonlinear relationship.

As an example, at a bump metal area of approximately area A, a signal frequency that can be reliably processed (e.g., reliably processed in accordance with a threshold reliability such as a bit error rate) is approximately frequency F1. A signal port portion including a bump metal having an area of approximately A would not be capable of reliably handling the signal at, for example, a target signal frequency of approximately F2. When the surface area is on the order of the size of a bond pad (e.g., hundreds of square microns), signal attenuation due to parasitic capacitance associated with the bond pad of a relatively high frequency may not be a concern because of the relatively small parasitic capacitance associated with the relatively small area of the bond pad. However, when the surface area is significantly larger such as the surface area of a bump metal (e.g., bump metal 110 shown in FIG. 1A), the attenuation caused by a parasitic metal capacitance associated with the relatively large area can be significant for relatively high frequencies such as frequencies greater than 100 mega-hertz (MHz). Accordingly, one or more of the techniques described herein, including series capacitances, bias resistors, bias voltages (e.g., direct-current (DC) bias voltage) applied using one or more voltage sources, and/or so forth, can be used to enable reliable handling of the signal despite the relatively large area of the bump metal.

Referring back to FIG. 1A, in this embodiment, the signal port portion 100 is configured so that the overall capacitance value of the signal port portion 100 can be decreased or minimized (for reliable signal handling). As shown in FIG. 1A, the bump metal 110, the dielectric 120 and the region 130 collectively define a capacitor, which is represented in FIG. 1B as capacitor C1. A depletion region 133 associated with the PN junction 132 of an interface between region 130 and region 140 defines a second capacitor, which is represented in FIG. 1B as capacitor C2 in series (at node A) with capacitor C1. Similarly, a depletion region 143 associated with the PN junction 142 of an interface between region 140 and region 150 defines a third capacitor, which is represented in FIG. 1B as capacitor C3 in series with capacitor C2 (at node B).

In some embodiments, the capacitor C1 can be referred to as a parasitic metal capacitance, and the capacitors C2 and C3 can be referred to as depletion capacitors. The overall capacitance of the signal port portion can be represented by the combination of capacitors C1 through C3 (which are between the bump metal node 112 to ground GND in series).

The capacitors C2 and C3 are included in series with capacitor C1 in signal port portion 100 to decrease the overall capacitance value of the signal port portion 100. In other words, the two additional series semiconductor junctions are added to decrease the overall capacitance value between the bump metal 110 and ground GND (e.g., a ground voltage GND, a substrate). The capacitors C1, C2, and C3 have respective capacitance values that can be reduced and are in series (as shown FIG. 1B) to collectively form a capacitance value (e.g., a total or overall capacitance value) that is lower than any one of the capacitance values of capacitors C1 through C3 alone. For example, the capacitors C2 and C3 (e.g., depletion capacitors) are defined within the signal port portion 100 to decrease the overall capacitance of the signal port portion 100 to a capacitance value that is lower than a capacitance value of the capacitor C1 alone (which is a parasitic metal capacitance).

In this embodiment, a width M1 (also can be referred to as a thickness) of the dielectric 120 can be defined so that the capacitance value of the capacitor C1 associated with the dielectric 120 can be decreased (e.g., minimized). For example, the dielectric 120 can include multiple oxide layers so that the width M1 of the dielectric 120 can be relatively large. In some embodiments, the dielectric 120 can include a combination of different types of dielectric layers including a thermal oxide layer, a deposited oxide layer, a trench isolation layer (e.g., a shallow trench isolation (STI) layer), and/or so forth. In some embodiments, the dielectric 120 can include more than three oxide layers (e.g., four oxide layers, five oxide layers). Details related to layers that can be included in a dielectric are described at least in connection with FIG. 4.

In addition to the width M1 of the dielectric 120, one or more conductors (e.g., a metal) below the bump metal 110 and within the dielectric 120 can be excluded to increase (or maximize) the dielectric 120 between the bump metal 110 and ground GND. In other words, at least portion of the dielectric 120 can include an exclusion zone 170 where one or more conductors (e.g., metals, polysilicon layers, silicides) are excluded from a volume below the bump metal 110. If viewed from above, the exclusion zone 170 can have a surface area approximately equal to, or greater than, a surface area of the bump metal 110. In some embodiments, the exclusion zone 170 can have a surface area approximately equal to, or greater than a surface area of region 130, region 140, and/or region 150. In some embodiments, the exclusion zone 170 can have a surface area (when viewed from above) approximately less than (e.g., slightly smaller than) a surface area (when view from above) of the bump metal 110. In some embodiments, a shape of the exclusion zone 170 can be different than that shown in FIG. 1A. However, the surface area of exclusion zone 170 (when viewed from above) can have a surface area at least 90% to 95% of a surface area of the bump metal 110 (when viewed from above).

In this embodiment, a width M2 of the depletion region 133 and/or a width M3 of the depletion region 143 can be defined so that the capacitance value of the capacitor C2 and/or the capacitance value of the capacitor C3 respectively associated the depletion region 133 and/or the depletion region 143 can be decreased (e.g., minimized) (i.e., the depletion region is increased so that the capacitance value is decreased). In some embodiments, one or more of the series semiconductor junctions (i.e., PN junction 132 and/or PN junction 142) can be electrically biased (e.g., biased with a DC voltage) to decrease (or maximize) capacitance values (e.g., a capacitance value in series) of one or more of the depletion regions (i.e., depletion region 133 and/or depletion region 143) to thereby decrease the overall capacitance value of the signal port portion 100 (through series connections).

For example, a voltage (e.g., a bias voltage, a non-zero voltage, a non-floating voltage) can be applied to the region 130 and/or a voltage (e.g., a bias voltage, a non-zero voltage, a non-floating voltage) can be applied to the region 140 to increase the width M2 of the depletion region 133 beyond a width of the depletion region 133 if region 130 and/or region 140 were electrically floating. Similarly, a voltage (e.g., a bias voltage, a non-zero voltage, a non-floating voltage) can be applied to the region 140 and/or a (e.g., a bias voltage, a non-zero voltage, a non-floating voltage) voltage can be applied to the region 150 to increase the width M3 of the depletion region 143 beyond a width of the depletion region 143 if region 140 and/or region 150 were electrically floating.

As a specific example, region 150 (which can be associated with a substrate) can be grounded at the ground voltage GND. In other words, the region 150 can be at the ground voltage GND (e.g., potential) or the ground voltage GND can be applied to the region 150. Region 140 can be biased to a voltage (e.g., a positive voltage) that is greater than the ground voltage GND, and region 130 can be biased to a voltage (e.g., a negative voltage) that is less than the ground voltage GND. In some embodiments, the positive voltage applied to the region 140 can be approximately the same as or higher than (e.g., 0.1 V, 1 V, 5 V, 10 V) the ground voltage GND. Similarly, the negative voltage applied to region 130 can be approximately equal to or lower than (e.g., −0.1 V, −1 V, −5 V, −10 V) the ground voltage GND).

In some embodiments, the ground voltage GND can be a nonzero voltage. In some embodiments, a voltage applied to the bump metal 110 can span a voltage range and can be associated with a signal. In some embodiments, a voltage applied to one or more of the regions 130 through 150 can be within, or outside of a voltage range associated with a signal applied to the bump metal 110. In some embodiments, a voltage applied to one or more of the regions 130 through 150 can be different than a maximum and/or a minimum voltage included in a voltage range of a signal applied to the bump metal 110.

As a specific example, a signal applied to the bump metal 110 can be based on a voltage range between approximately −5 V and +5 V. A positive voltage applied to region 130 can be +10 V, which can be outside of the voltage range, and a negative voltage applied to region 140 can be −10 V, which is also outside of the voltage range. In this embodiment, the positive voltage applied to region 130 and the negative voltage applied to region 140 are different than the maximum voltage (+5 V) and the minimum voltage (−5 V) of the voltage range of the signal. The ground voltage GND can be at approximately 0 V, which is within the voltage range of the signal.

In some embodiments, one or more of the voltages applied to one or more of the regions 130 through 150 can be produced by a charge pump voltage source. For example, a positive charge pump voltage source can be configured to provide a positive voltage to region 130, and a negative charge pump voltage source can be configured to provide a negative voltage to region 140. More details related to voltage sources (e.g., charge pump voltage sources) associated with a signal port portion are described in connection with FIG. 3.

Although not shown in FIG. 1A, in some embodiments, one or more bias resistors can be coupled to one or more of the regions 130 through 150. In some embodiments, the bias resistors can be configured to isolate one or more of the regions 130 through 150 with one or more bias voltages applied to the one or more of the regions 130 through 150. Accordingly, in the signal port portion 100, the bump metal 110 can be coupled to a relatively high impedance to ground GND across a relatively wide range of signal frequencies applied to the bump metal 110.

For example, a bias resistor can be included in (e.g., disposed within, coupled to) an electrical path between a pump voltage source (e.g., a positive charge pump voltage source) (not shown) and region 130. The bias resistor can provide high frequency isolation of the region 130 from the voltage source. In other words, the bias resistor can function as a high impedance for the voltage source, which can itself be a low impedance voltage source. By doing so, the voltage source can be isolated by the bias resistor from changes in voltage (e.g., changes in voltage associated with a signal) that are applied to the bump metal 110 and propagate through the signal port portion 100. In some embodiments, the bias resistors, or equivalent impedance, can be included in (e.g., incorporated within) the voltage source.

In some embodiments, the width M2 of the depletion region 133 can be greater than or equal to the width of the depletion region 143. In some embodiments, the width M2 of the depletion region 133 can be less than the width of the depletion region 143. The relative widths of the depletion regions 133, 143 can be defined using bias voltage(s) coupled to one or more of the regions 130, 140, 150. In some embodiments, the width M2 of the depletion region 133 and/or the width M3 of the depletion region 143 can be equal to or less than the width M1 of the dielectric 120. In some embodiments, the width M1 of the dielectric 120 can be less than the width M2 of the depletion region 133 and/or the width M3 of the depletion region 143.

In some embodiments, dopants (e.g., P-type dopants, N-type dopants) included in one or more of the regions 130 through 150 can be defined so the width M2 of the depletion region 133 and/or the width M3 of the depletion region 143 can be increased. For example, the region 140 can be doped with a relatively high N-type dopant concentration and the region 150 can be doped with a relatively high P-type dopant concentration so that the depletion region 143 will have a width M3 that is greater than the width M3 of the depletion region 143 if the dopant concentration in region 140 and/or in region 150 were relatively low. In some embodiments, a dopant concentration of a lightly doped side (e.g., a lightly doped N side, a lightly doped P side) of one or more of the PN junctions 132, 142 can be decreased so that the depletion widths (e.g., the depletion widths 133, 143) can be increased (e.g., maximized).

The signal port portion 100 can be included in a computing component that can be, for example, a transceiver (e.g., a transceiver associated with a cable connection), a sensor, a transistor, a microprocessor, an application-specific integrated circuit (ASIC), a discrete component, a circuit board, and so forth. The signal port portion 100 can be included in (e.g., integrated into) a computing device. In some embodiments, the computing device can be, for example, a computer, a personal digital assistant (PDA), a mobile phone, a host computer, an electronic measurement device, a data analysis device, a telecom device, a television device, a device configured for lightning protection, a cell phone, an electronic device, and/or so forth. In some embodiments, the signal port portion 100 can be integrated into a computing component such as a single integrated component (e.g., single discrete component) or an integrated component including several other semiconductor devices.

The signal port portion 100 is made of a semiconductor material and can be produced using semiconductor processing techniques. For example, the signal port portion 100 can be formed using (e.g., formed within, formed on) at least a portion of a semiconductor substrate.

Figure 3:
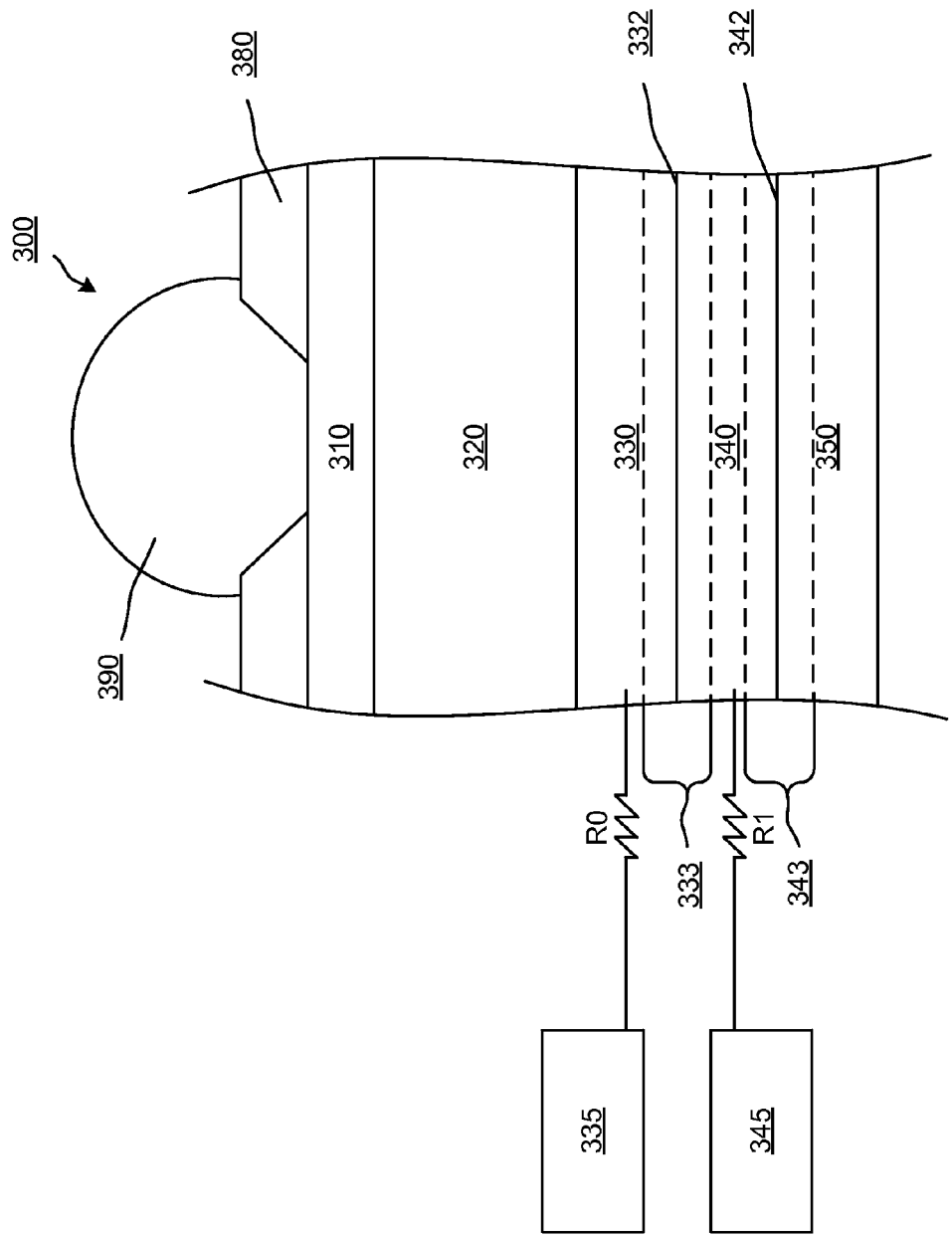
FIG. 3 is a diagram of a side cross-sectional view of another signal port portion of a computing component.

FIG. 3 is a diagram of a side cross-sectional view of another signal port portion 300 of a computing component. The signal port portion 300 shown in FIG. 3 is a variation of the signal port portion 100 shown in FIG. 1A. In some embodiments, the signal port portion 300 can be included in, for example, an I/O port of a computing component.

In this embodiment, the signal port portion 300 is made of a P-type semiconductor substrate (e.g., a semiconductor substrate having a P-type dopant). At least a portion of the P-type semiconductor substrate defines a P-type region 350 of the signal port portion 300. As shown in FIG. 3, the signal port portion 300 has a dielectric 320 disposed between a bump metal 310 and a P-type region 330 so that the bump metal 310 is disposed on the dielectric 320 (and the dielectric 320 is disposed below the bump metal 310) and so that the dielectric 320 is disposed on the P-type region 330 (and the P-type region 330 is disposed below the dielectric 320). The dielectric 320, the bump metal 310, and the P-type region 330 define a capacitor (e.g., a parasitic metal capacitance). In some embodiments, a dopant concentration of the P-type region 330 can be greater than a dopant of the P-type region 350. An N-type region 340 is disposed between the P-type region 330 and the P-type region 350 so that the P-type region 330 is disposed on the N-type region 340 (and the N-type region 340 is disposed below the P-type region 330) and so that the N-type region 340 is disposed on the P-type region 350 (and the P-type region 350 is disposed below the N-type region 340).

As shown in FIG. 3, a depletion region 333 (which defines a capacitor) associated with a PN junction 332 is formed by an interface between the P-type region 330 and the N-type region 340, and a depletion region 343 (which defines a capacitor) associated with a PN junction 342 is formed by an interface between the N-type region 340 and the P-type region 350. A voltage source 335 is coupled via a bias resistor R0 to the P-type region 330, and a voltage source 345 is coupled via a bias resistor R1 to the N-type region 340. The voltage source 335 is configured to apply a voltage to the P-type region 330 to increase a width of the depletion region 333 compared with a width of the depletion region 333 without the applied voltage (i.e., if the P-type region 330 were floating). Similarly, the voltage source 345 is configured to apply a voltage to the N-type region 340 to increase a width of the depletion region 343 compared with a width of the depletion region 343 without the applied voltage (i.e., if the N-type region 340 were floating). In accordance with the principles described above in connection with FIG. 1A, the relatively large depletion width of the depletion region 333 and the depletion region 343 can result in relatively small capacitance values in series that can decrease the overall capacitance value of the signal port portion 300.

In some embodiments, the voltage source 335 and/or the voltage source 345 can be, for example, a charge pump voltage source. In some embodiments, the voltage source 335 can be a negative voltage source (e.g., a negative charge pump voltage source or other negative voltage source) configured to provide a negative voltage (e.g., a negative charge pump voltage, a negative bias voltage) to the P-type region 330. In contrast, the voltage source 345 can be a positive voltage source (e.g., a positive charge pump voltage source or other positive voltage source) configured to provide a positive voltage (e.g., a positive charge pump voltage, a positive bias voltage) to the N-type region 340.

Although not shown in FIG. 3, in some embodiments, a voltage source can be configured to provide a bias voltage to the P-type region 350. In some embodiments, the voltage source can be a negative voltage source. In some embodiments, the voltage source 335 can be coupled to the P-type region 350 so that a voltage applied to the P-type region 330 can be the same as a voltage applied to the P-type region 350. In such embodiments, a bias resistor (not shown) can be included in an electrical path between a voltage source and the P-type region 350.

Although not shown in FIG. 3, additional depletion type capacitors can be coupled in series within the signal port portion 300. For example, an additional PN junction (not shown) can be formed in the signal port portion 300 and disposed below the PN junction 342. In some embodiments, an additional PN junction can be formed in the signal port portion 300 and disposed between the PN junction 332 and the PN junction 342. In such embodiments, the additional PN junction can be biased using one or more voltage sources. In some embodiments, the additional PN junction can be a floating PN junction that has a depletion width based on doping concentrations associated with a P-type region and an N-type region that forms the additional PN junction. Although not shown in FIG. 3, less depletion type capacitors can be coupled in series within the signal port portion 300.

In this embodiment, the bias resistor R0 is configured to isolate the P-type region 330 from the voltage source 335, and the bias resistor R1 is configured to isolate the N-type region 340 from the voltage source 345. The bias resistors R0, R1 can be configured to provide high frequency isolation of the P-type region 330 and the N-type region 340, respectively, from the voltage source 335 and the voltage source 345, respectively. One or more of the bias resistors R0 and R1 can be configured to prevent (or substantially prevent) a low impedance path to ground through one or more of the voltage sources 335, 345. Accordingly, the widths of one or more of the PN junctions 332, 342 may not be decreased (or eliminated) by being shorted to ground (or another voltage) through the low impedance path. In other words, the widths of one or more of the PN junctions 332, 342 can be maintained using one or more of the bias resistors R0, R1. The bias resistors R0 and R1 can be configured with a relatively high impedance so that as a voltage applied to the bump metal 310 moves (at a relatively high frequency) the voltage can be passed via capacitive coupling through the capacitors associated with one or more of the PN junctions 332, 342 without decreasing a depletion width of (or shorting) one or more of the PN junctions 332, 342.

Although not shown in FIG. 3, in some embodiments, one or more of the elements included in FIG. 3 can be mirrored. For example, a separate resistor (not shown) can be coupled to a side of the P-type region 330 that is opposite (or adjacent) a side to which the resistor R0 is coupled. As another example, a separate voltage source (not shown) can be coupled to a side of the P-type region 330 that is opposite a side to which the voltage source 335 is coupled via resistor R0.

As shown in FIG. 3, a solder bump 390 can be coupled to (e.g., in contact with, bonded to) a nonconductive layer 380 and/or the bump metal 310. In some embodiments, the bump metal 310 can be referred to as, or can function as, an under bump metallization (UBM) layer.

Figure 4A:
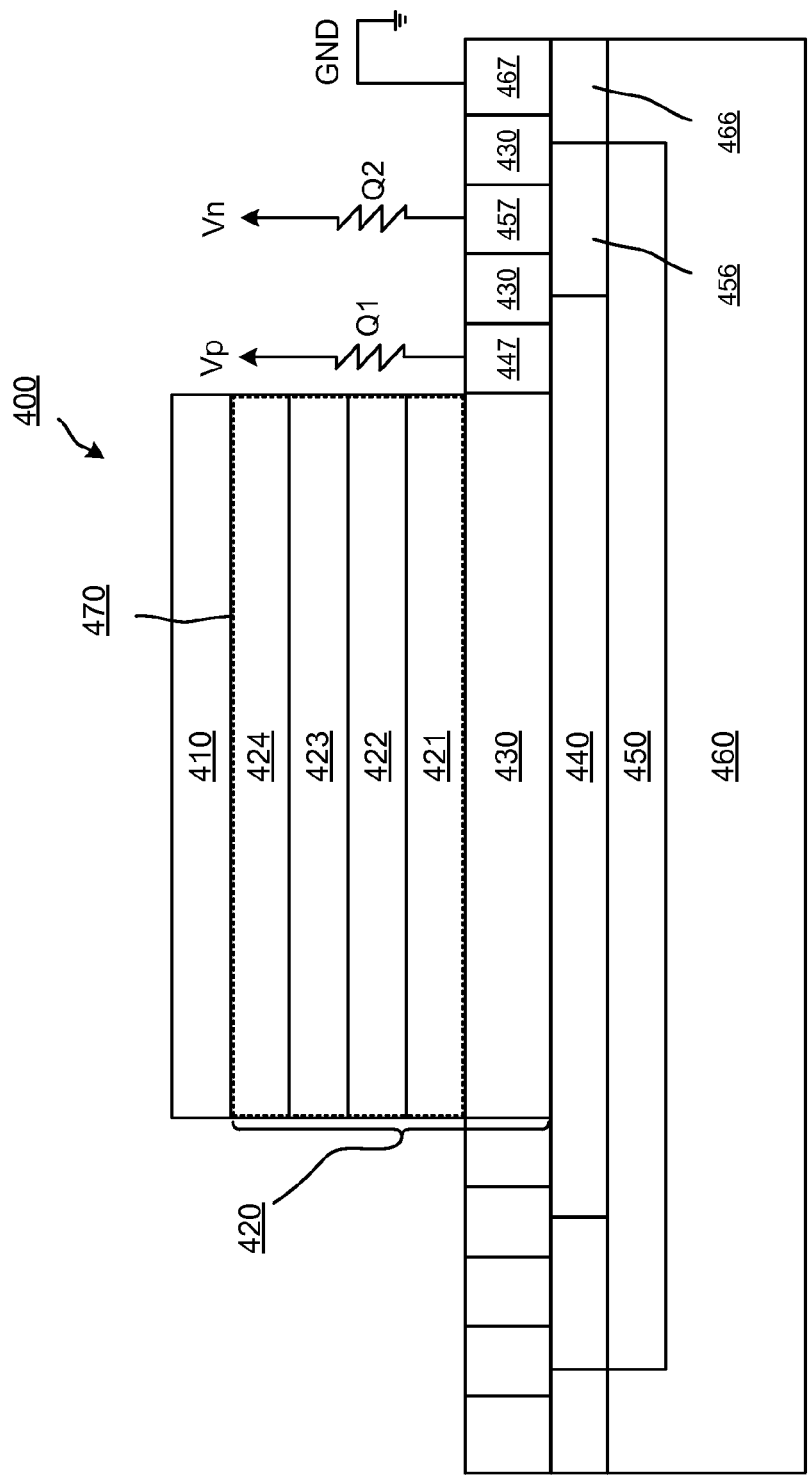
FIG. 4A is a diagram of a side cross-sectional view of yet another signal port portion of a computing component.

FIG. 4A is a diagram of a side cross-sectional view of yet another signal port portion 400 of a computing component. The signal port portion 400 shown in FIG. 4A is a variation of at least the signal port portion 100 shown in FIG. 1A. As with the other signal port portions described herein, in some embodiments, the signal port portion 400 can be included in, for example, an I/O port of a computing component. The computing component can be included in an integrated circuit and/or can be included in a discrete semiconductor device. In this embodiment, many of the elements are labeled on only one side of the signal port portion 400, however, the elements can be mirrored on the other side of the signal port portion 400.

The signal port portion 400 includes a P-type substrate 460. The signal port portion 400 has a dielectric 420 (which can also be referred to as a dielectric region) disposed between a bump metal 410 and at least a portion of a shallow trench isolation (STI) layer 430 (which collectively define a capacitor). In this embodiment, the dielectric 420 includes several layers of dielectric material (also can be referred to as dielectric layers) associated with metal layers within the signal port portion 400 and/or the STI layer 430. The dielectric 420 includes a metal 1 exclusion layer 421, a metal 2 exclusion layer 422, a metal 3 exclusion layer 423, a metal 4 exclusion layer 424, and the STI layer 430. For example, the metal 1 exclusion layer 421 is a layer of dielectric where metal (or another conductor) is excluded from the dielectric layer. The metal 1 exclusion layer 421, the metal 2 exclusion layer 422, the metal 3 exclusion layer 423, and the metal 4 exclusion layer 424 can collectively define an exclusion zone 470. In some embodiments, the STI layer 430 can be included in the exclusion zone 470.

In some embodiments, the dielectric 420 can include different dielectric layers than those shown in FIG. 4A. In some embodiments, the dielectric 420 can include less metal exclusion layers than shown in FIG. 4A. In some embodiments, the dielectric 420 can include more metal exclusion layers that shown in FIG. 4A. For example, the dielectric 420 can include an additional metal exclusion layer (e.g., a metal 5 exclusion layer) that is not shown in FIG. 4A. As another example, the dielectric 420 can include a polysilicon exclusion layer that is not shown in FIG. 4A.

As shown in FIG. 4A, a high voltage (HV) P-well region 440 is disposed below the STI layer, and an N+ buried region 450 (e.g., an N-type heavily doped buried region) is disposed below the HV P-well region 440. An interface between the HV P-well region 440 and the N+ buried region 450 defines (e.g., forms) a PN junction having a depletion width that functions as a capacitor in series with a capacitor collectively defined by the bump metal 410, dielectric 420, and the HV P-well region 440.

As shown in FIG. 4A, the P-type substrate 460 is disposed below the N+ buried region 450. An interface between the N+ buried region 450 and the P-type substrate define (e.g., form) a PN junction having a depletion width that functions as a capacitor in series with the capacitor collectively defined by the HV P-well region 440 and the N+ buried region 450.

As shown in FIG. 4A, portions of the STI layer 430 insulate doped regions that function as contacts to the HV P-well region 440, the N+ buried region 450, and the P-type substrate 460. Specifically, a portion of the STI layer 430 is disposed between a P+ region 447 (e.g., a P-type heavily doped region) in contact with the HV P-well region 440 and an N+ region 457. The N+ region 457 is electrically coupled to the N+ buried region 450 via an HV N-well region 456. Also, a portion of the STI layer 430 is disposed between the N+ region 457 and a P+ region 467. The P+ region 467 is electrically coupled to the P-type substrate 460 via an HV P-well region 466. In some embodiments, the HV P-well region 440 and the HV P-well region 466 can be formed using the same semiconductor process and mask.

Although not shown in FIG. 4A, in some embodiments, the signal port portion 400 can be formed without an STI layer 430 (or portions thereof). In such embodiments, the P+ region 447 can be in contact (in a lateral direction) with the N+ region 457, and the N+ region 457 can be in contact (in a lateral direction) with the P+ region 467. Also, in such embodiments, the HV P-well region 440 can be in contact with metal 1 exclusion layer 421. In some embodiments, additional layers can be included in the signal port portion 400 that are not shown in FIG. 4A. For example, additional dielectric layers can be disposed between the STI layer 430 and a metal 1 exclusion layer 421 and/or between the STI layer 430 and the HV P-well region 440.

Although not shown in FIG. 4A, additional or different dopant regions can be included within the signal port portion 400. For example, the HV P-well region 440 can be replaced with a low voltage (LV) P-well region, and/or the N+ buried region 450 can be a different type of doped region. As another example, additional PN junctions that are not shown in FIG. 4A can be defined and included within the signal port portion 400. In some embodiments, less PN junctions than are shown in FIG. 4A can be included within the signal port portion 400.

As shown in FIG. 4A, a bias resistor Q1 is coupled to the P+ region 447, and a bias resistor Q2 is coupled to the N+ region 457. Although not shown in FIG. 4A, in some embodiments, the bias resistor Q1 can be a polysilicon resistor and/or the bias resistor Q2 can be a polysilicon resistor. Specifically, one or more of the bias resistors Q1, Q2 can include at least a portion of a polysilicon layer disposed on a surface of the semiconductor device.

The bias resistors Q1 and Q2 provide bias voltages for the PN junctions to increase the depletion regions, thereby reducing the overall capacitance of the signal port portion 400 and making the capacitance to GND lower. Bias resistor Q1 and Q2 provide a mechanism to apply a DC bias voltage across the HV P-well region 440 to the N+ buried region 450 and N+ buried region 450 to P-type substrate 460 through a low pass network.

The resistance values of bias resistors Q1 and Q2 affect the frequency range over which the overall capacitance of the signal port portion 400 is reduced, so relatively high resistance values are used for the bias resistors Q1 and Q2. In some embodiments, the resistance value of one or more of the bias resistors Q1, Q2 can be between 50 kilo-ohms (k$\Omega$) to 1 mega-ohm (M$\Omega$) (e.g., 300 k$\Omega$, 500 k$\Omega$, 700 k$\Omega$). In some embodiments, the resistance value of one or more of the bias resistors Q1, Q2 can be greater than 1 M$\Omega$ or less than 50 k$\Omega$. More details related to the effect of bias resistor values on capacitance are discussed in connection with at least FIG. 5.

As shown in FIG. 4A, a voltage Vp is provided to the HV P-well region 440 via the P+ region 447, and a voltage Vn is provided to the N+ buried region 450 via the N+ region 457. In some embodiments, the voltage Vp can be provided by one or more voltage sources, and the voltage Vn can be provided by one or more voltage sources. Also as shown in FIG. 4A, a ground voltage GND is provided to the P-type substrate 460 via P+ region 467.

In some embodiments, at least some portions of the features shown in FIG. 4A can be included in an epitaxial layer disposed on, or grown on a semiconductor substrate. Although not shown in FIG. 4A, additional depletion type capacitors can be coupled in series within the signal port portion 400.

Figure 4B:
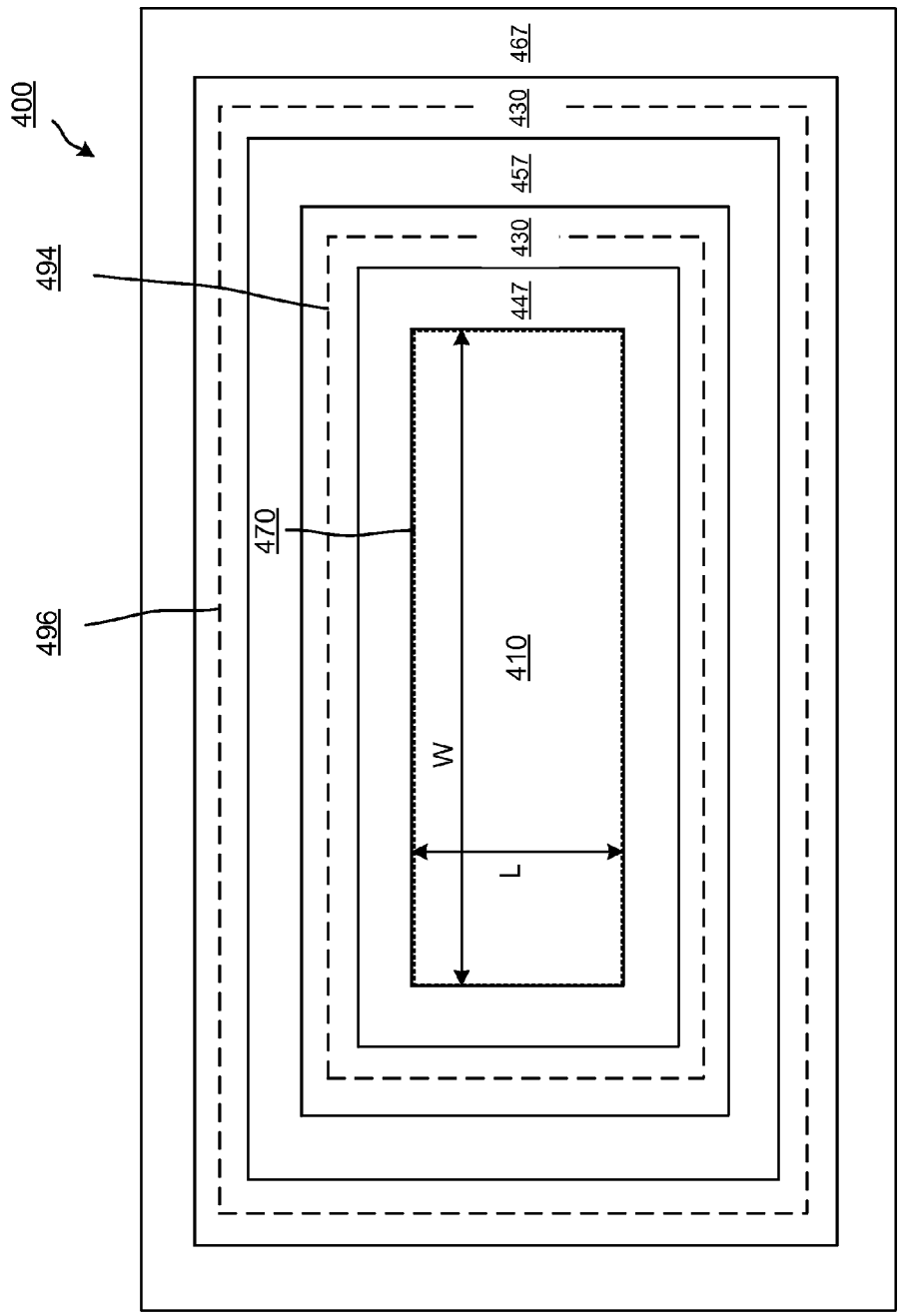
FIG. 4B is a diagram that illustrates a top view of the signal port portion shown in FIG. 4A.

FIG. 4B is a diagram that illustrates a top view of the signal port portion 400 shown in FIG. 4A. As shown in FIG. 4A, the P+ region 447 is disposed around the bump metal 410, and at least a portion of the STI layer 430 is disposed between the P+ region 447 and the N+ region 457. Also, at least a portion of the STI layer 430 is disposed between the N+ region 457 and the P+ region 467.

In this embodiment, an interface boundary 494 (which forms a PN junction) between the HV P-well region 440 (which can be a region of a first conductivity type) and the HV N-well region 456 is illustrated as a dashed line. The interface boundary 494 corresponds approximately with a surface area of the HV P-well region 440. Also, an interface boundary 496 (which forms a PN junction) between the HV N-well region 456 and the HV P-well 466 is illustrated as a dashed line. The interface boundary 496 corresponds approximately with a surface area of the N+ buried region 450 (which can be a region of a second conductivity type).

As shown in FIG. 4B, a surface area (which is defined by a length and a width) of the bump metal 410 is approximately disposed within a surface area defined by an inner boundary of the P+ region 447. Also, although the STI layer 430 below the bump metal 410 is not shown in FIG. 4B (because it is disposed below the bump metal 410), the STI layer 430 has a surface area approximately equal to a surface area of the bump metal 410.

Also, as shown in FIG. 4B, the bump metal 410 has a surface area that is smaller than a surface area of the HV P-well region 440. In this embodiment, the bump metal 410 is entirely disposed within the interface boundary 494 associated with the HV P-well region 440. In some embodiments, the bump metal 410 can have a surface area that is approximately equal to or greater than a surface area of the HV P-well region 440. A width W of the bump metal 410 can be smaller than a width of an interior boundary defined by the P+ region 447. In some embodiments, the width W of the bump metal 410 can be greater than or smaller than the width of the interior boundary defined by the P+ region 447. If greater than the width of the interior boundary defined by the P+ region 447, the width W of the bump metal 410 can be disposed over at least a portion of the P+ region 447, disposed over the portion STI layer 430 disposed between the P+ region 447 and the N+ region 457, and/or so forth. Similarly, a length L of the bump metal 410 can be smaller than a length of an interior boundary defined by the P+ region 447. In some embodiments, the length L of the bump metal 410 can be greater than or smaller than the length of the interior boundary defined by the P+ region 447. If greater than the length of the interior boundary defined by the P+ region 447, the length L of the bump metal 410 can be disposed over at least a portion of the P+ region 447, disposed over the portion STI layer 430, disposed between the P+ region 447 and the N+ region 457, and/or so forth.

As shown in FIG. 4B, the exclusion zone 470 has a surface area (when viewed from above) that is the same as (e.g., approximately the same as) the surface area of the bump metal 410. In some embodiments, the exclusion zone 470 can have a surface area that is greater than the surface area of the bump metal 410, or less than the surface area of the bump metal 410.

Although not shown in FIG. 4A or 4B, various semiconductor features (including metals layers, polysilicon layers, dielectric layers, and/or so forth) can be disposed over, for example the P+ region 447, the portions of the STI layer 430, the N+ region 457, and/or the P+ region 467. Although the bump metal 410 is shown in FIG. 4B as having a rectangular shape, in some embodiments, the bump metal 410 can have a different shape such as a square shape, a circular shape, a triangular shape, and/or so forth. In some embodiments, the exclusion zone 470 can have a shape that is the same as (e.g., approximately the same as) or different than that of the bump metal 410.

Figure 5:
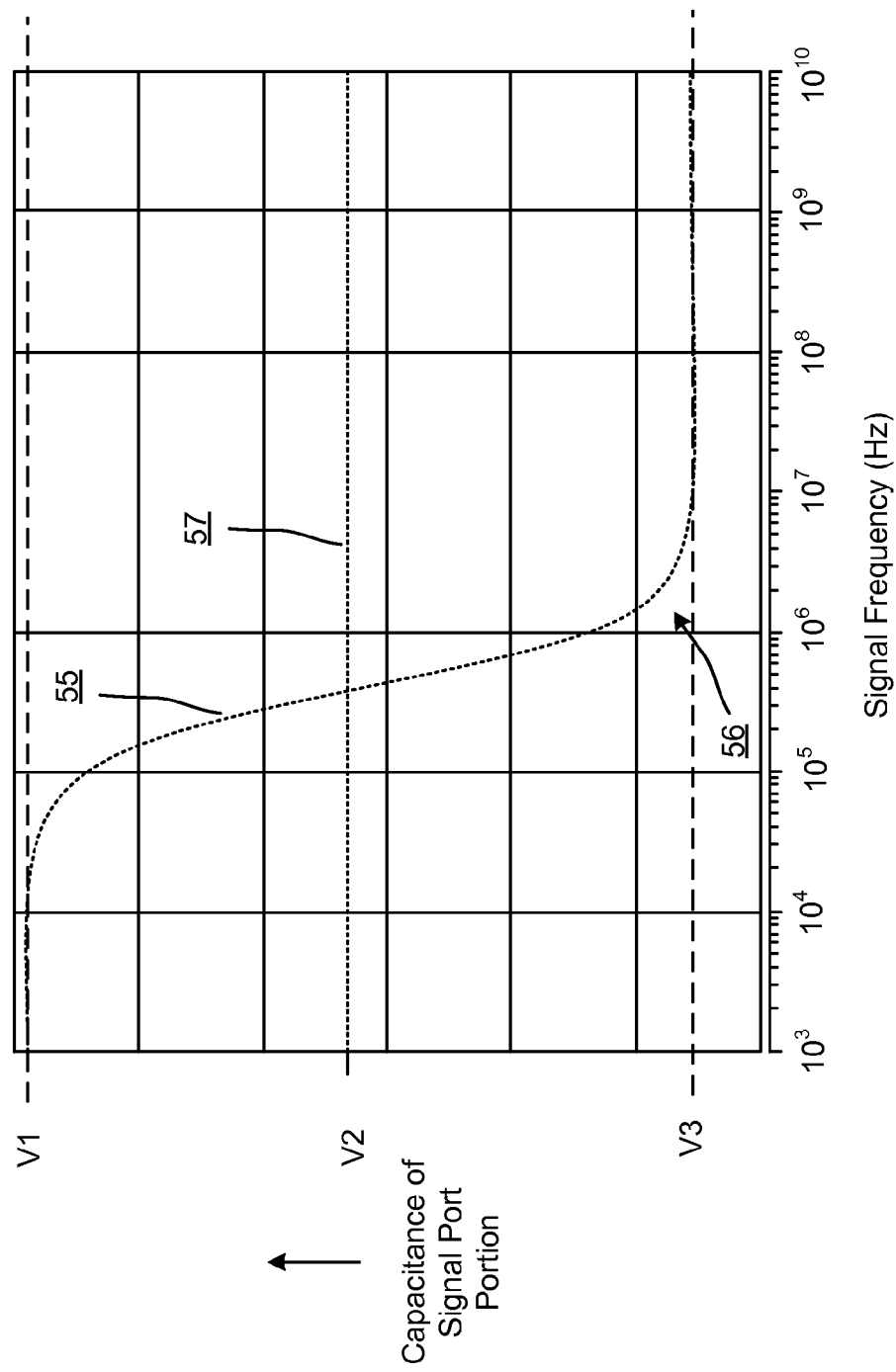
FIG. 5 is a graph that illustrates a capacitance curve associated with a signal port portion configured in accordance with the embodiments described herein.

FIG. 5 is a graph that illustrates a capacitance curve 55 associated with a signal port portion configured in accordance with the embodiments described herein. Specifically, the capacitance curve 55 illustrates a capacitance of the signal port portion (shown along a y-axis) in response to a frequency sweep of a signal (shown along the x-axis). Specifically, the capacitance curve 55 is associated with a signal port portion including two depletion region capacitances in series with a parasitic metal capacitance and two bias resistors, similar to the configuration shown in, for example, FIG. 3 or FIG. 4A.

As shown in FIG. 5, the capacitance curve 55 starts at a capacitance value V1 at a frequency of approximately 1 kilohertz (kHz), and remains at approximately the first capacitance value V1 until after approximately 10 kHz. The capacitance of the signal port portion decreases until approximately the capacitance value V3. The capacitance curve 55 can be referred to as having a corner 56 at a frequency slightly greater than 1 megahertz (MHz). The capacitance at capacitance value V1 can be referred to as a base bump capacitance, and the capacitance at capacitance value V3 can be referred to as an attenuated bump capacitance. The base bump capacitance can be an overall capacitance of the signal port portion with unbiased depletion capacitances (without bias voltages applied) and without bias resistors.

In some embodiments, the capacitance values V1 and V3 can be a few hundred femto-Farads (fF). In some embodiments, one or more of the capacitance values V1, V3 can be greater than a few hundred fF or less than a few hundred fF. For example, the capacitance value V1 can be approximately 280 fF and the capacitance value V3 can be approximately 230 fF. In some embodiments, a decrease in overall capacitance of the signal port portion from the base bump capacitance to the attenuated bump capacitance can be greater than 15% (e.g., 20%, 25%, 50%).

As the resistance value of one or more of the bias resistors (e.g., bias resistor Q1, bias resistor Q2) is increased, the capacitance curve 55 shifts to the left (to a lower frequency), and as the resistance value of one or more of the bias resistors is decreased, the capacitance curve 55 shifts to the right (to a higher frequency). Specifically, the corner 56 shifts to the left as the resistance value of one or more of the bias resistors is increased. The resistor value of one or more of the bias resistors can be configured so that the corner 56 is between approximately 1 MHz and 10 MHz. In some embodiments, the resistor value of one or more of the bias resistors can be configured so that the corner 56 is at approximately 1 MHz. In some embodiments, the resistor values of one or more of the bias resistors can be configured so that the corner 56 is greater than 1 MHz, or less than 1 MHz. In some embodiments, signal degradation may not be a design consideration at relatively low frequencies (e.g., at frequencies below the corner 56), but signal degradation caused by a relatively large parasitic metal capacitance associated with a bump metal may be a design consideration at frequencies approximately at or above the corner frequency.

Capacitance curve 57 illustrates a capacitance of a signal port portion configured with biased depletion capacitances, but without bias resistors. As shown in FIG. 5, the capacitance curve 57 has approximately a constant capacitance value V2. In some embodiments, the capacitance value V2 can be a few hundred fF. In some embodiments, the capacitance values V2 can be greater than a few hundred fF or less than a few hundred fF. For example, the capacitance value V2 can be approximately 250 fF. Without the bias resistors, the capacitance value V2 may cause an intolerable level of signal degradation at frequencies approximately at or above the corner frequency.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or subcombinations of the functions, components and/or features of the different embodiments described.

What is claimed is:

1. An apparatus, comprising:
a first capacitor defined by a dielectric disposed between a bump metal and a region of a first conductivity type; and
a second capacitor in series with the first capacitor and defined by a PN junction including the region of the first conductivity type and a region of a second conductivity type,
the region of the first conductivity type configured to be coupled to a first node having a first voltage, the region of the second conductivity type configured to be coupled to a second node having a second voltage different than the first voltage.

2. The apparatus of claim 1, wherein at least one of the first voltage or the second voltage is a bias voltage different than a voltage associated with a signal applied to the bump metal.

3. The apparatus of claim 1, wherein the first capacitor includes a plurality of dielectric layers disposed between the bump metal and the region of the first conductivity type.

4. The apparatus of claim 1, wherein the region of the first conductivity type is a first region of the first conductivity type, the PN junction is a first PN junction,
the apparatus further comprising:
a third capacitor in series with the second capacitor, the third capacitor defined by a second PN junction including the region of the second conductivity type and a second region of the first conductivity type.

5. The apparatus of claim 1, wherein the region of the first conductivity type is a first region of the first conductivity type, the PN junction is a first PN junction,
the apparatus further comprising:
a third capacitor in series with the second capacitor, the third capacitor defined by a second PN junction including the region of the second conductivity type and a second region of the first conductivity type,
the second region of the first conductivity type configured to be coupled to a third node having a third voltage different than the first voltage and different than the second voltage.

6. The apparatus of claim 1, wherein the region of the first conductivity type is a first region of the first conductivity type, the PN junction is a first PN junction,
the apparatus further comprising:
a third capacitor in series with the second capacitor, the third capacitor defined by a second PN junction including the region of the second conductivity type and a second region of the first conductivity type, the second region of the first conductivity type configured to be coupled to a ground node at a ground voltage, the first voltage being less than the ground voltage and the second voltage being greater than the ground voltage.

7. The apparatus of claim 1, wherein the region of the first conductivity type is a P-type well region, the region of the second conductivity type is an N-type buried layer.

8. The apparatus of claim 1, further comprising:
a voltage source; and
a polysilicon bias resistor disposed within an electrical path between the voltage source and the region of the first conductivity type.

9. An apparatus, comprising:
a substrate having a first conductivity type, the substrate being coupled to a first node configured to have a first voltage;
a doped region of a second conductivity type disposed on the substrate;
a doped region of the first conductivity type disposed on the doped region of the second conductivity type and coupled to a second node configured to have a second voltage less than the first voltage;
a plurality of dielectric layers disposed on the doped region of the first conductivity type; and
a bump metal disposed above the plurality of dielectric layers.

10. The apparatus of claim 9, wherein the bump metal has a surface area smaller than a surface area of the doped region of the first conductivity type.

11. The apparatus of claim 9, wherein the plurality of dielectric layers include a shallow trench isolation layer,
the apparatus further comprising:
a contact layer surrounding at least a portion of the shallow trench isolation layer, the shallow trench isolation layer having a surface area approximately equal to a surface area of the bump metal.

12. The apparatus of claim 9, further comprising:
a negative voltage source coupled to the second node and configured to provide the second voltage; and
a bias resistor disposed in an electrical path between the doped region of the first conductivity type and the negative voltage source.

13. The apparatus of claim 9, further comprising:
a charge pump voltage source coupled to the second node and configured to provide the second voltage; and
a bias resistor disposed between the doped region of the first conductivity type and the charge pump voltage source, the bias resistor being a polysilicon bias resistor.

14. The apparatus of claim 9, wherein the doped region of the second conductivity type is coupled to a third node configured to have a third voltage greater than the first voltage.

15. The apparatus of claim 9, wherein the first voltage is a ground voltage, the second voltage is a negative voltage relative to the ground voltage, the doped region of the second conductivity type is coupled to a third node configured to have a positive voltage relative to the ground voltage that is greater than the ground voltage and greater than the negative voltage.

16. The apparatus of claim 9, wherein the second voltage is a negative voltage,
the apparatus further comprising:
a negative charge pump voltage source coupled to the second node and configured to provide the negative voltage; and
a positive charge pump voltage source coupled to the doped region of the second conductivity type and configured to provide a positive voltage to the doped region of the second conductivity type.

17. The apparatus of claim 9, wherein the substrate includes silicon carbide (SiC).

18. An apparatus, comprising:
a substrate having a first conductivity type;
a doped region of a second conductivity type disposed on the substrate;
a doped region of the first conductivity type disposed on the doped region of the second conductivity type;
at least one dielectric layer disposed on the doped region of the first conductivity type;
a bump metal disposed above the at least one dielectric layer; and
a bias resistor electrically coupled between the doped region of the second conductivity type and a voltage source, the substrate being coupled to a first node configured to have a first voltage, the voltage source being configured to provide a second voltage less than the first voltage.

19. The apparatus of claim 18, wherein the bias resistor is a first bias resistor and the voltage source is a first voltage source,
the apparatus further comprising:
a second bias resistor electrically coupled between the doped region of the first conductivity type and a second voltage source different from the first voltage source.

20. The apparatus of claim 18, wherein the at least one dielectric layer is disposed in a metal exclusion zone.

21. The apparatus of claim 18, wherein a capacitance at the bump metal has a corner at a signal frequency greater than approximately 1 Megahertz.

* * * * *

UNITED STATES PATENT AND TRADEMARK OFFICE
CERTIFICATE OF CORRECTION

PATENT NO.        : 8,928,142 B2
APPLICATION NO.   : 13/774135
DATED             : January 6, 2015
INVENTOR(S)       : Kenneth P. Snowdon Page 1 of 1

It is certified that error appears in the above-identified patent and that said Letters Patent is hereby corrected as shown below:

On the Title Page, Item (72), in column 1, in "Inventor", line 1, delete "Fairmouth," and insert -- Falmouth, --, therefor.

Signed and Sealed this
Twelfth Day of May, 2015

Michelle K. Lee
*Director of the United States Patent and Trademark Office*